United States Patent
Wang et al.

(10) Patent No.: US 10,056,473 B1
(45) Date of Patent: Aug. 21, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chih-Hao Wang, Hsinchu County (TW); Wai-Yi Lien, Hsinchu (TW); Gwan-Sin Chang, Hsinchu (TW); Yu-Ming Lin, Taipei (TW); Ching Hsueh, Taipei (TW); Jia-Chuan You, Taoyuan County (TW); Chia-Hao Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/481,748

(22) Filed: Apr. 7, 2017

(51) Int. Cl.
| | |
|---|---|
| *H01L 21/335* | (2006.01) |
| *H01L 21/8232* | (2006.01) |
| *H01L 29/66* | (2006.01) |
| *H01L 29/417* | (2006.01) |
| *H01L 21/8234* | (2006.01) |
| *H01L 21/8238* | (2006.01) |
| *H01L 21/84* | (2006.01) |
| *H01L 29/78* | (2006.01) |

(52) U.S. Cl.
CPC ............ *H01L 29/66795* (2013.01); *H01L 21/823431* (2013.01); *H01L 21/823821* (2013.01); *H01L 21/845* (2013.01); *H01L 29/41791* (2013.01); *H01L 29/7855* (2013.01)

(58) Field of Classification Search
CPC .......... H01L 29/7855; H01L 29/66795; H01L 21/845
USPC ........................................ 438/142
See application file for complete search history.

(56) References Cited

U.S. PATENT DOCUMENTS

| | | | |
|---|---|---|---|
| 8,742,503 B2 * | 6/2014 | Wang | ............ H01L 21/84 257/347 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |

(Continued)

*Primary Examiner* — David Vu
*Assistant Examiner* — Brandon Fox
(74) *Attorney, Agent, or Firm* — McClure, Qualey & Rodack, LLP

(57) ABSTRACT

A method for manufacturing a semiconductor device, including forming a dummy gate structure on a substrate, in which the substrate has a source/drain portion and a channel portion adjacent to the source/drain region, and the dummy gate structure is formed on the channel portion of the substrate; recessing at least a part of the source/drain portion to form a recess in the source/drain portion of the substrate; forming a stress material in the recess; replacing the dummy gate structure with a gate stack; removing the stress material in the recess after the replacing the dummy gate structure with the gate stack; and forming an epitaxy structure in the recess.

20 Claims, 9 Drawing Sheets

(56) References Cited

U.S. PATENT DOCUMENTS

| | | | | |
|---|---|---|---|---|
| 2013/0119370 A1* | 5/2013 | Wu | ..................... | H01L 21/3065 |
| | | | | 257/43 |
| 2015/0187905 A1* | 7/2015 | Cai | ..................... | H01L 29/6681 |
| | | | | 257/288 |
| 2015/0364326 A1* | 12/2015 | Xie | ....................... | H01L 29/665 |
| | | | | 257/288 |
| 2015/0364378 A1* | 12/2015 | Xie | ................... | H01L 21/82343 |
| | | | | 257/368 |

* cited by examiner

SEMICONDUCTOR DEVICE AND MANUFACTURING METHOD THEREOF

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). FinFET devices are a type of multi-gate structure that include semiconductor fins with high aspect ratios and in which channel and source/drain regions of semiconductor transistor devices are formed. A gate is formed over and along the sides of the fin structure (e.g., wrapping) utilizing the increased surface area of the channel and source/drain regions to produce fast, reliable and well-controlled semiconductor transistor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
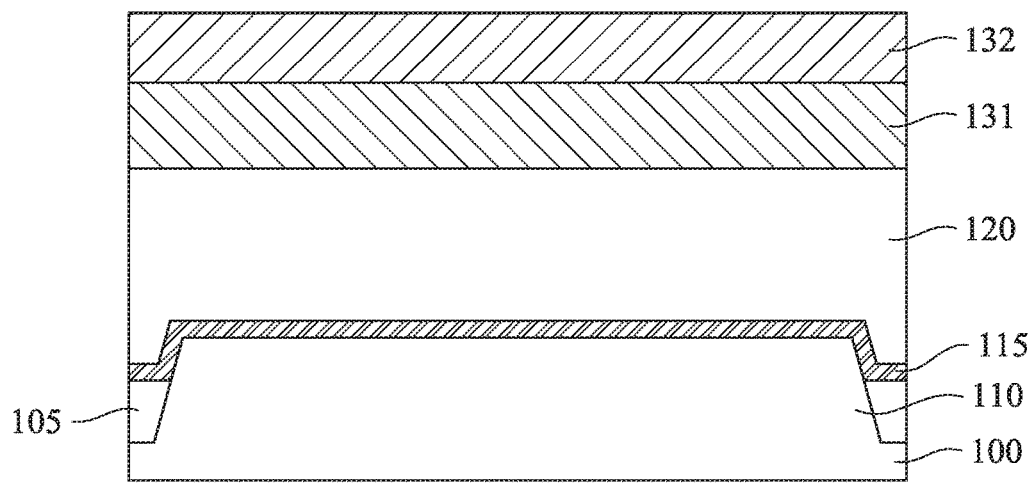
FIGS. 1 to 17 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of structures that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

FIGS. 1 to 17 are cross-sectional views of a method for manufacturing a semiconductor device 10 at various stages in accordance with some embodiments of the present disclosure.

Reference is made to FIG. 1. A substrate 100 is provided. The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

Some exemplary substrate 100 also includes an insulator layer. The insulator layer includes suitable materials, including silicon oxide, sapphire, and/or combinations thereof. An exemplary insulator layer may be a buried oxide layer (BOX). The insulator is formed by one or more suitable process(es), such as implantation (e.g., SIMOX), oxidation, deposition, and/or other suitable process. In some exemplary semiconductor substrate 100, the insulator layer is a component (e.g., layer) of a silicon-on-insulator substrate.

The substrate 100 may also include various doped regions. The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

In some embodiments, the substrate 100 also includes a fin structure 110. The fin structure 110 may include Si, SiGe, silicon germanium tin (SiGeSn), GaAs, InAs, InP, or other suitable materials. In some embodiments, the fin structure 110 is formed by one or more suitable process(es) including various deposition, photolithography, and/or etching processes. As an example, the fin structure 110 is formed by patterning and etching a portion of the substrate 100. In some embodiments, a layer of photoresist material (not shown) is sequentially deposited over the substrate 100. The layer of photoresist material is irradiated (exposed) in accordance with a desired pattern (the semiconductor fin 110 in this case) and developed to remove portions of the photoresist material. The remaining photoresist material protects the underlying material from subsequent processing steps, such as etching. It should be noted that other masks, such as an oxide or silicon nitride mask, may also be used in the etching process.

The fin structure 110 may be patterned by any suitable method. For example, the fin structure 110 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structure 110.

An isolation structure 105 is formed on the substrate 100 and adjacent to the fin structure 110. The isolation structure 105, which acts as a shallow trench isolation (STI) around the fin structure 110 may be formed by chemical vapor deposition (CVD) techniques using tetra-ethyl-ortho-silicate (TEOS) and oxygen as a precursor. In yet some other embodiments, the isolation structure 105 is insulator layers of a SOI wafer.

A gate dielectric 115, a dummy gate material layer 120, a first mask 131 and a second mask 132 are deposited sequentially on a substrate 100 by, for example, low pressure CVD (LPCVD) and plasma enhanced (PECVD).

The gate dielectric 115 may be formed by thermal oxidation, chemical vapor deposition, sputtering, or other methods known and used in the art for forming a gate dielectric. The gate dielectric 115 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

The dummy gate material layer 120 may include materials having different etching selectivity from the materials of the first mask 131 and the second mask 132, such as polycrystalline silicon, amorphous silicon and/or microcrystal silicon. The first mask 131 and the second mask 132, which are used as a hard mask layer during etching later, may include silicon oxide, silicon nitride and/or silicon oxynitride. The material of the first mask 131 may be different from that of the second mask 132. For example, the first mask 131 made from silicon oxide may be located below or above the second mask 132 made from silicon nitride. In some embodiments, the dummy gate material layer 120 may include polycrystalline-silicon (poly-Si) or poly-crystalline silicon-germanium (poly-SiGe). Further, the dummy gate material layer 120 may be doped poly-silicon with uniform or non-uniform doping.

The first mask 131 and the second mask 132, in some other embodiments, may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof.

Figure 2:
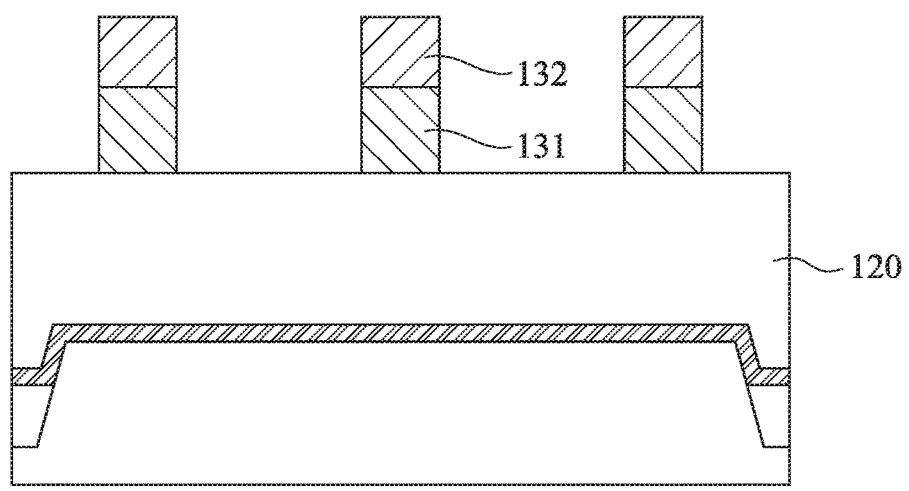

Reference is made to FIG. 2. A photo resist pattern (not shown) is coated on the second mask 132 and is exposed and developed to form a desire pattern. The second mask 132 and the first mask 131 are dry etched (such as plasma etching) in turn with the photo resist pattern as a mask, until the dummy gate material layer 120 is exposed. As a result, the patterned first mask 131 and the patterned second mask 132 are formed. The plasma etching gas may include gas containing halogen, for example, fluoro-gases such as fluorocarbon gas ($C_xH_yF_z$), $NF_3$, $SF_6$, or other halogen-containing gases such as $Cl_2$, $Br_2$, HBr, HCl, or it may include oxidants such as oxygen, ozone and oxynitride. In some embodiments, after etching, wet cleaning is performing with deionized water and the like or dry cleaning is performing with oxygen, fluorinated gas and the like to completely remove the resultant of etching.

Figure 3:
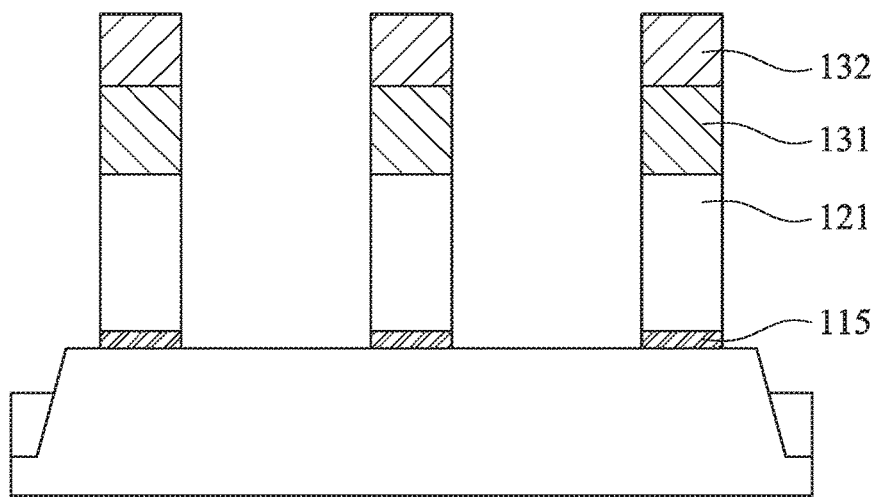

Reference is made to FIG. 3. A removing (or etch) process is then performed to remove portions other than the intended pattern of the dummy gate material layer 120 and the gate dielectric 115 to form at least one dummy gate structure 121. For example, in FIG. 3, three dummy gate structures 121 are formed. In some embodiments, the dummy gate material layer 120 and the gate dielectric 115 of FIG. 2 may be patterned by an etching process, such as a dry plasma etching process or a wet etching process. At least one parameter, such as etchant, etching temperature, etching solution concentration, etching pressure, source power, radio frequency (RF) bias voltage, etchant flow rate, of the patterning (or etching) recipe can be tuned. For example, the same or similar dry etching process used for etching the patterned second mask 132 and the first mask 131, such as plasma etching, may be used to etch the dummy gate material layer 120 and the gate dielectric 115 until the fin structure 110 is exposed.

Figure 4:
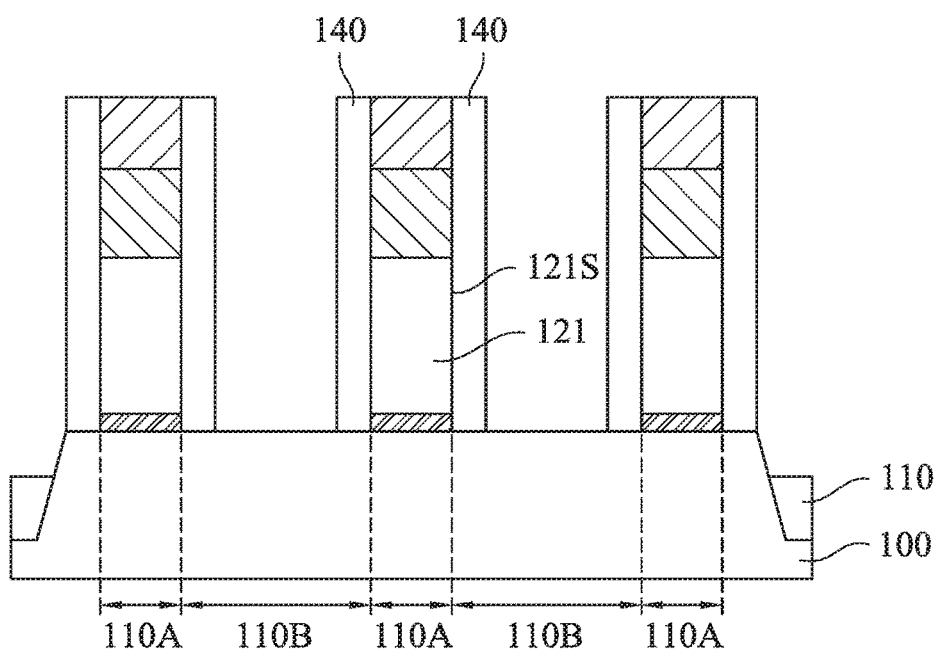

Reference is made to FIG. 4. A plurality of gate spacers 140 are formed respectively on opposite sidewalls 121S of the dummy gate structures 121, the gate dielectric 115, and the mask layer 130. In some embodiments, at least one of the gate spacers 140 includes single or multiple layers. The gate spacers 140 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, and other methods known in the art. The gate spacers 140 may include different materials with different etch characteristics than the dummy gate structures 121 so that the gate spacers 140 may be used as masks for the patterning of the dummy gate structures 121. The gate spacers 140 may then be patterned, such as by one or more etch(es) to remove the portions of the gate spacers 140 from the horizontal surfaces of the structure.

The fin structure 110 of the substrate 100 includes a plurality of channel portions 110A and a plurality of source/drain portions 110B adjacent to the channel portions 110A, in which the channel portions 110A is covered by the dummy gate structures 121, and the source/drain portions 110B are uncovered by the dummy gate structures 121. In other words, the dummy gate structures 121 are formed on the channel portions 110A of the fin structure 110 of the substrate 100.

Figure 5:
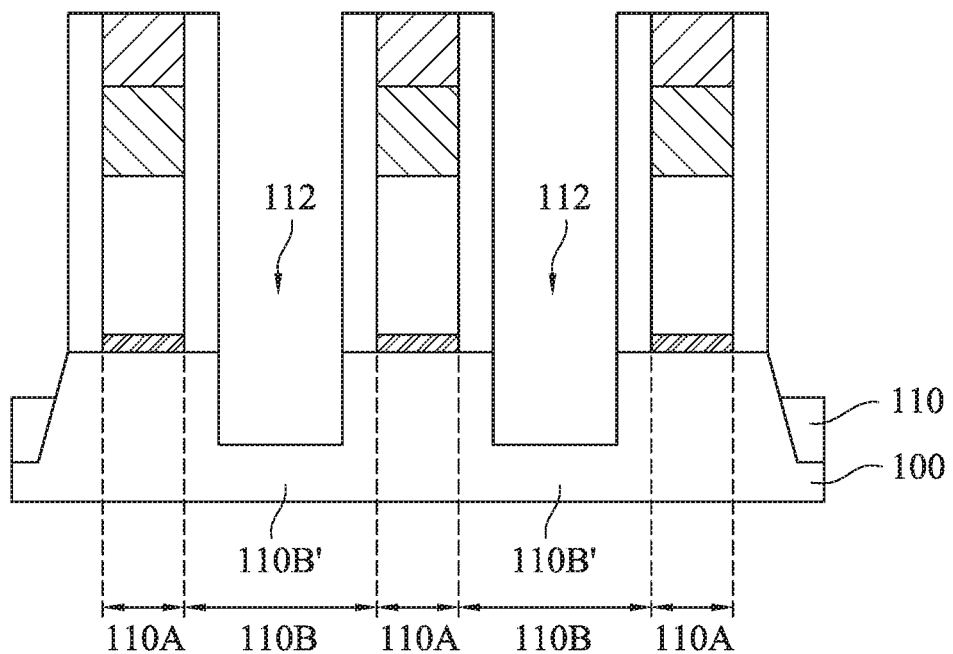

Reference is made to FIG. 5. At least part of the source/drain portions 110B of the fin structure 110 of the substrate 100 are recessed to form a plurality of recesses 112 in the source/drain portions 110B of the fin structure 110 of the substrate 100. After the recessing process, each of the source/drain portions 110B includes a recessed portion 110B'. The recessed portion 110B' of the source/drain portions 110B is adjacent to the channel portions 110A. The source/drain portions 110B of the fin structures 110 may be recessed by suitable process including dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH4OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 6:
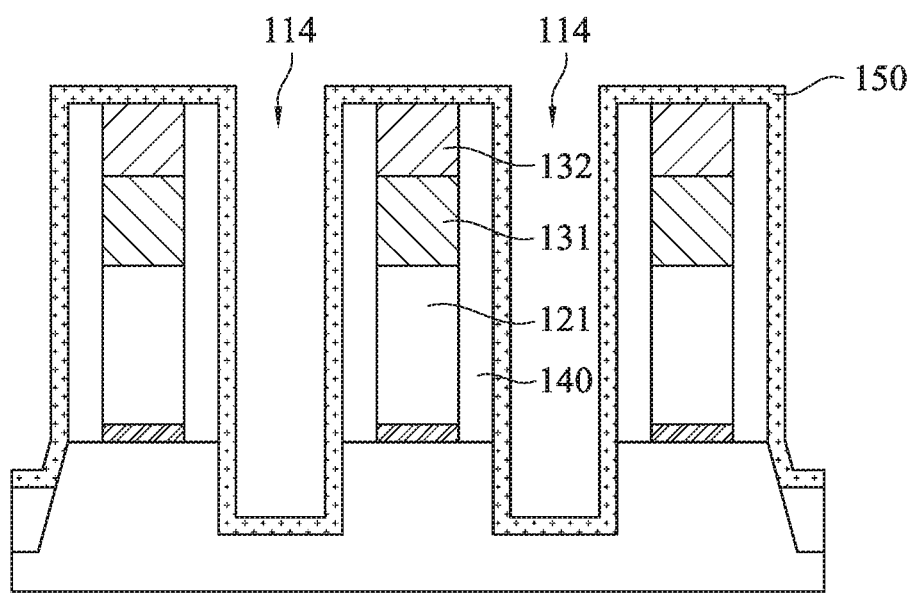

Reference is made to FIG. 6. A buffer layer 150 is conformally formed over the dummy gate structures 121, the first mask 131 and second mask 132 of the mask layer 130, the gate spacers 140, and in the recesses 112 (shown in FIG. 5). In some embodiments, the buffer layer 150 may be made from oxide, and may be formed by physical vapor deposition (PVD), chemical vapor deposition (CVD), or other suitable deposition techniques. After forming the buffer layer 150, a plurality of recesses 114 are formed in the fin structure 110 and between the dummy gate structures 121.

Figure 7:
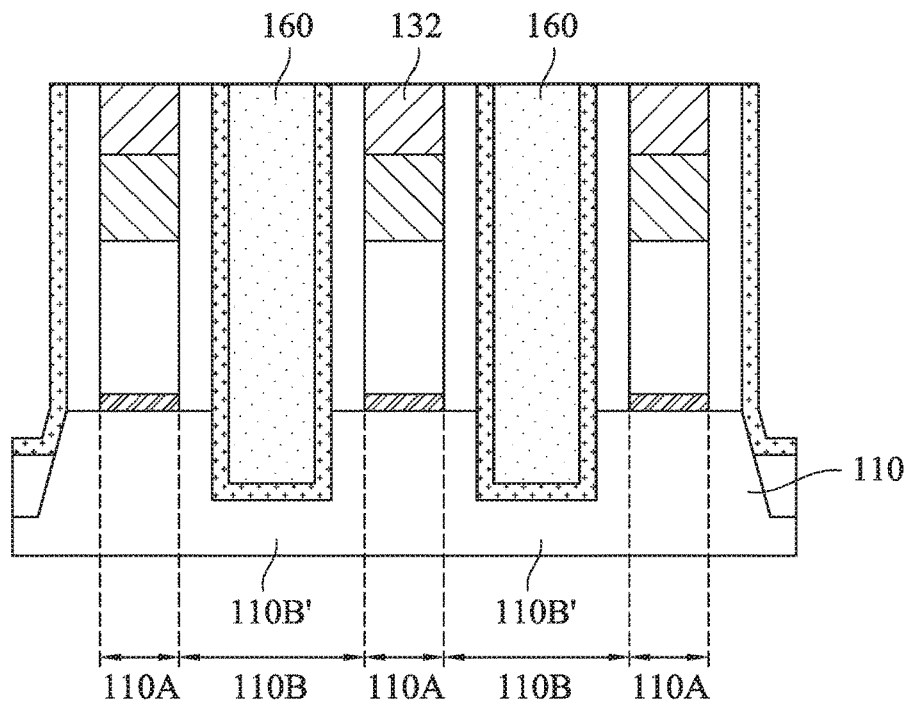

Reference is made to FIG. 7. A plurality of stress materials 160 are formed respectively in the recesses 114 (shown in FIG. 6) in the fin structure 110 and between the dummy gate structures 121. The formation of the stress materials 160 may include forming a stress material layer over the substrate 100, and following with a chemical mechanical planarization (CMP) to remove the excessive stress materials 160 until the second mask 132 is exposed. In some embodiments, the stress materials 160 may be a shrinkage material, and may include silicon carbide (SiC), silicon nitride (SiN), silicon oxycarbide (SiOC), or amorphous silicon (a-Si) for a NMOS transistor.

For example, in some embodiments, stress materials 160 made from silicon carbide (SiC) may be deposited by CVD using Si—C contained material (i.e., tetramethylsilane (TMS)) as precursors, and may be formed in a process accomplished between about 200 to about 450 C, with a pressure between about 1 to about 10 Torr.

In some other embodiments, stress materials 160 made from silicon nitride (SiN) may be deposited by CVD using dichlorosilane (DCS) and $NH_3$ as precursors, and may be formed in a process accomplished between about 250 to about 500 C, with a pressure between about 1 to about 10 Torr.

In some other embodiments, stress materials 160 made from silicon oxycarbide (SiOC) may be deposited by CVD using Si—C contained material and $H_2O$ as precursors as precursors, and may be formed in a process accomplished between about 200 to about 450 C, with a pressure between about 1 to about 10 Torr.

In some other embodiments, stress materials 160 made from amorphous silicon (a-Si) may be deposited by CVD using $SiH_4$ and $Si_2H_6$ as precursors as precursors, and may be formed in a process accomplished between about 350 to about 530 C, with a pressure between about 0 to about 11 Torr.

The stress materials 160 are disposed in the recessed portion 110B' of the source/drain portions 110B of the fin structure 110. Thus, portions of the stress materials 160 are adjacent to the channel portions 110A of the of the fin structure 110.

In some embodiments, stress or strain in a device may have components in three directions, parallel to the channel length, parallel to the device channel width, and perpendicular to the channel plane, in which the strains parallel to the device channel length and width are called in-plane strains. Due to the shrinkage of the stress materials 160, an in-plane tensile strain may be induced on the channel portions 110A of the fin structure 110.

Figure 8:
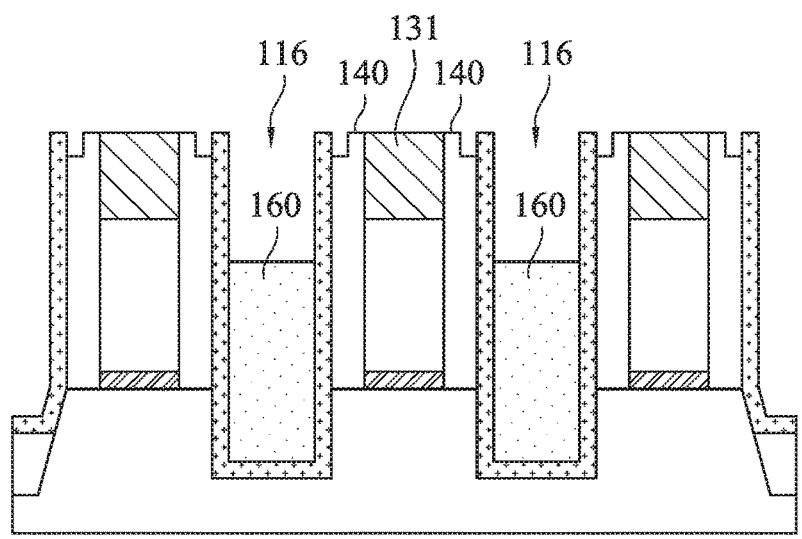

Reference is made to FIG. 8. Portions of the stress materials 160, the gate spacers 140, the buffer layer 150, and the second mask 132 (shown in FIG. 7) are removed. The removing process may be performed by one or more etch(es). During the removing process, a plurality of recesses 116 are formed between the dummy gate structures 121. After the second mask 132 is removed, the top surface of the first mask 131 is exposed. In some embodiments, the gate spacers 140 are partially etched, such that the gate spacers 140 have irregular surface.

Figure 9:
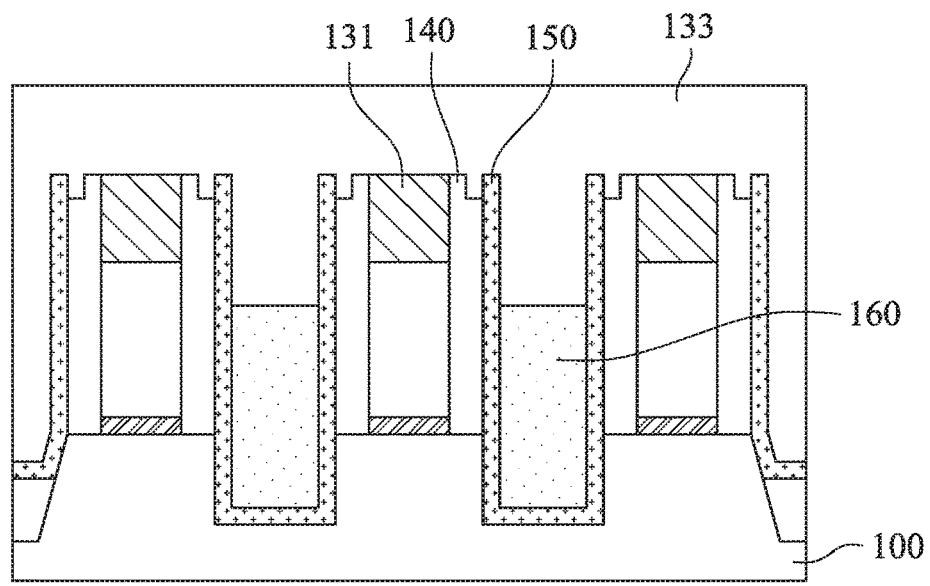

Reference is made to FIG. 9. A third mask 133 is formed over the substrate 100, in which the third mask 133 is filled in the recesses 116 (shown in FIG. 8) and formed on the stress materials 160. That is, the stress materials 160 is covered and protected by the third mask 133 during process(es) performed later. Moreover, the third mask 133 is formed on the gate spacers 140, the first mask 131, and the buffer layer 150.

Figure 10:
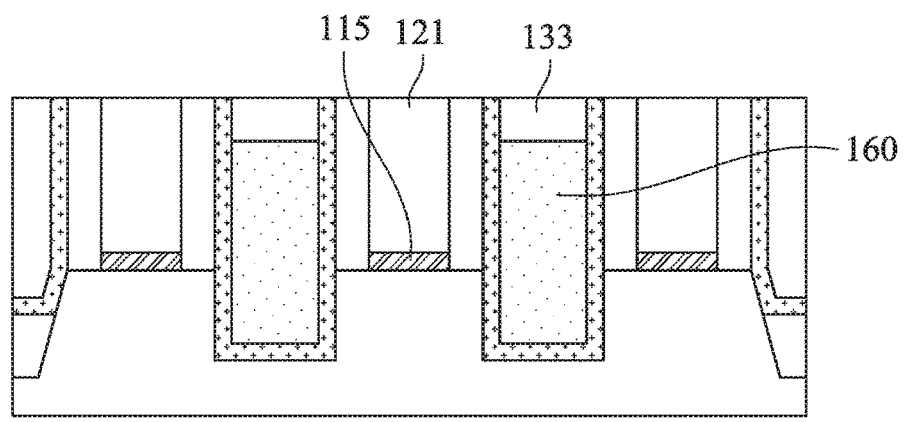

Reference is made to FIG. 10. A chemical mechanical planarization (CMP) process is performed to remove portions of the third mask 133. During the CMP process, the first mask 131 (shown in FIG. 9) is removed and the dummy gate structures 121 are exposed. The remaining portions of the third mask 133 cover the stress materials 160, respectively.

Figure 11:
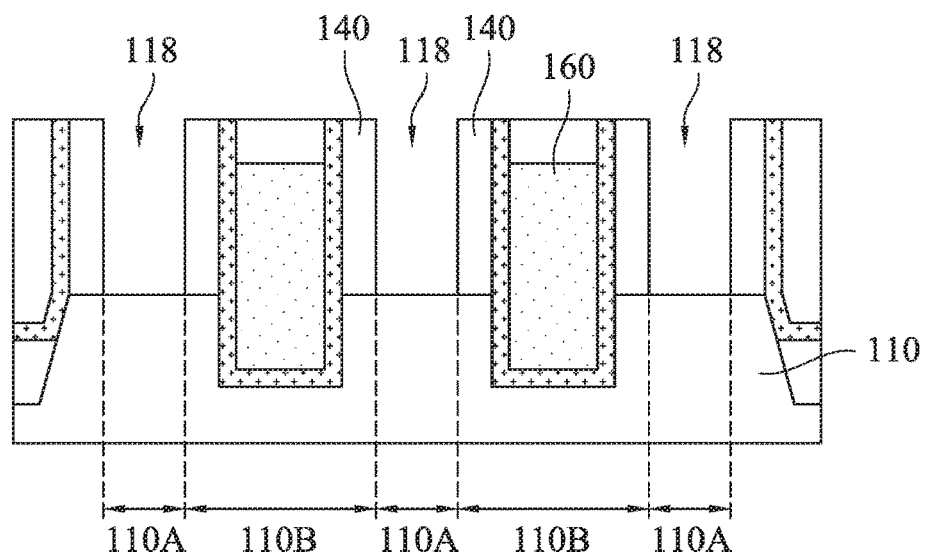

Reference is made to FIG. 11. A replacement gate (RPG) process scheme is employed. In some embodiments, in a RPG process scheme, a dummy gate structure is formed first and is replaced later by a metal gate after high thermal budget processes are performed. In some embodiments, the dummy gate structures 121 and the gate dielectric 115 (shown in FIG. 10) are removed to form a plurality of openings 118 between the gate spacers 140. The dummy gate structures 121 and the gate dielectric 115 may be removed by dry etch, wet etch, or a combination of dry and wet etch. For example, a wet etch process may include exposure to a hydroxide containing solution (e.g., ammonium hydroxide), deionized water, and/or other suitable etchant solutions.

The replacement gate process is performed after forming the stress materials 160 (see FIG. 7). In some embodiments, the dummy gate structures 121 provide a constraint force on the channel portion 110A of the fin structure 110. After the dummy gate structures 121 is removed, the constraint force applied on the channel portion 110A of the fin structure 110 disappears accordingly, such that the in-plane tensile strain on the channel portions 110A of the fin structure 110, induced by the stress materials 160, may be enhanced.

Figure 12:
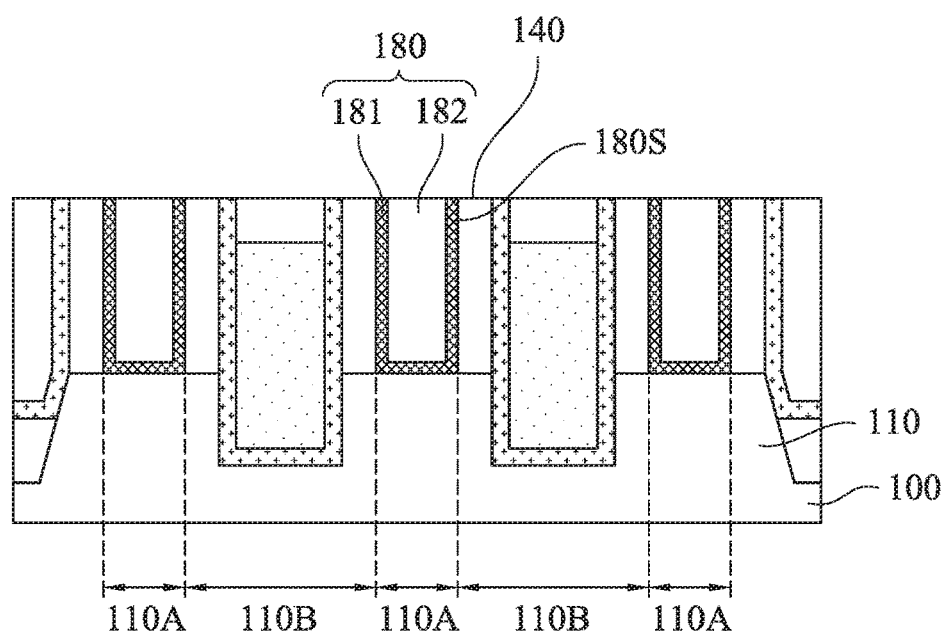

Reference is made to FIG. 12. A plurality of gate stacks 180 are formed in the openings 118 (shown in FIG. 11). In other words, the dummy gate structures 121 and the gate dielectric 115 (shown in FIG. 10) are replaced by the gate stacks 180, such that the spacers 140 are disposed on the sidewall 180S of the gate stacks 180. The gate stacks 180 are formed on the channel portions 110A of the fin structure 110 of the substrate 100. At least one of the gate stacks 180 includes an interfacial layer (not shown), a gate dielectric 181 formed over the interfacial layer, and a gate metal 182 formed over the gate dielectric 181. The gate dielectric 181, as used and described herein, includes dielectric materials having a high dielectric constant, for example, greater than that of thermal silicon oxide (~3.9). The gate metal 182 may include a metal, metal alloy, and/or metal silicide. Additionally, the formation of the gate stacks 180 may include depositions to form various gate materials, one or more liner layers, and one or more CMP processes to remove excessive gate materials and thereby planarize top surfaces of the gate stacks 180.

In some other embodiments, a work function metal layer included in the gate stacks 180 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process. In some embodiments, the gate stacks 180 formed is a p-type metal gate including a p-type work function layer. In some embodiments, the capping layer included in the gate stacks 180 may include refractory metals and their nitrides (e.g. TiN, TaN, W2N, TiSiN, TaSiN). The cap layer may be deposited by PVD, CVD, Metal-organic chemical vapor deposition (MOCVD) and ALD. In some embodiments, the fill layer included in the gate stacks 180 may include tungsten (W). The metal layer may be deposited by ALD, PVD, CVD, or other suitable process.

In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectric 181 may include a high-K dielectric layer such as hafnium oxide (HfO2). Alternatively, the gate dielectric 181 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric 181 may be formed by ALD, PVD, CVD, oxidation, and/or other suitable methods.

Figure 13:
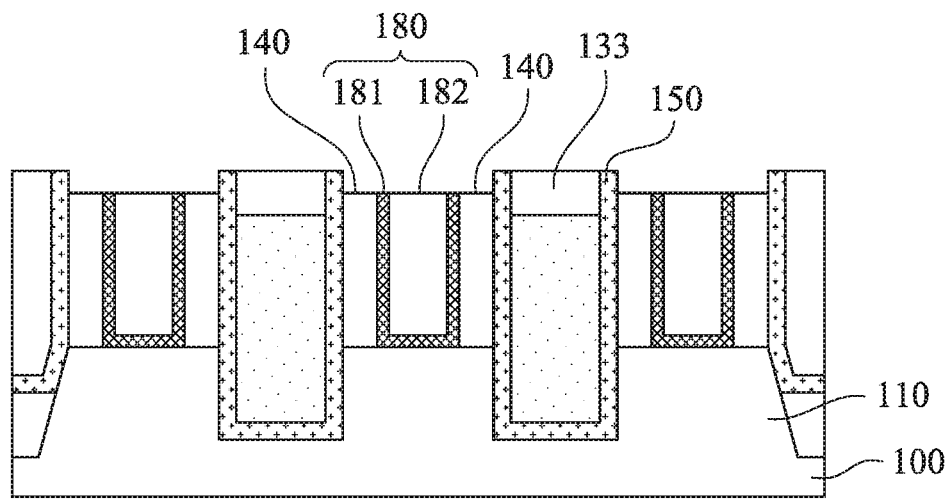

Reference is made to FIG. 13. A removing process is performed to the gate stacks 180 and the gate spacers 140 to partially remove the gate dielectric 181 and the gate metal 182 of the gate stacks 180, and the gate spacers 140. The etching process(es) may include a wet etch, a dry etch, and/or a combination thereof. As an example, a wet etching solution may include $HNO_3$, $NH_4OH$, KOH, HF, HCl, NaOH, $H_3PO_4$, and/or other suitable wet etching solutions, and/or combinations thereof. Alternatively, a dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some embodiments, the etching process is chosen to selectively etch the gate metal 182, the gate dielectric 181, and the gate spacers 140 without substantially etching the third mask 133 and the buffer layer 150. In some embodiments, the etching process is controlled such that top surfaces of the remaining gate metal 181, the gate dielectric 182, and the gate spacers 140 are substantially coplanar. The term "substantially" as used herein may be applied to modify any quantitative representation which could permissibly vary without resulting in a change in the basic function to which it is related.

Figure 14:
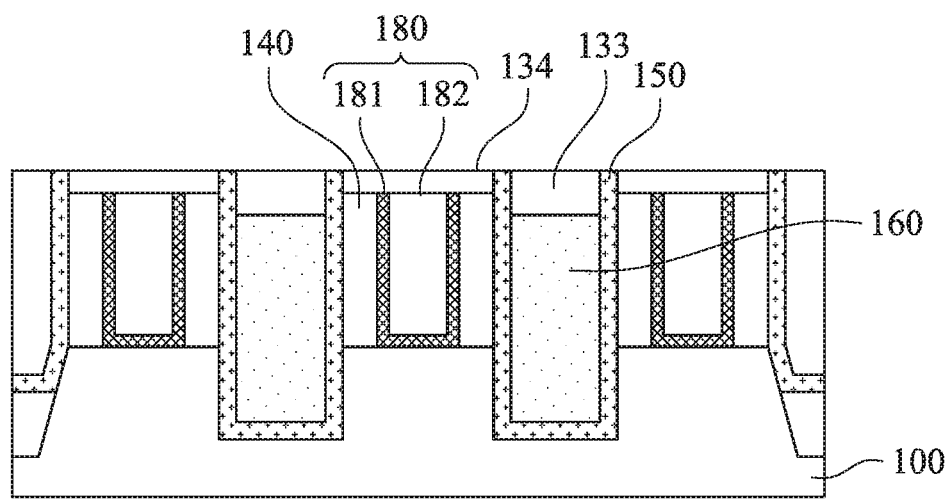

Reference is made to FIG. 14. A fourth mask 134 is formed over the substrate 100. The fourth mask 134 covers the gate dielectric 181, the gate metal 182, and the gate spacers 140. One or more CMP processes are performed to polish back the fourth mask 134, such that the top surface of the third mask 133 is exposed. In some embodiments, the fourth mask 134 may be a hard mask, and may include silicon carbon nitride (SiCN), aluminium oxide (AlO), aluminium oxynitride (AlON), hafnium oxide (HfO), or zirconium (ZrO), or other suitable materials. The fourth mask 134 may include a material which is different from the third mask 133, the stress materials 160, and the buffer layer 150 to achieve etching selectivity during etching processes performed later.

Figure 15:
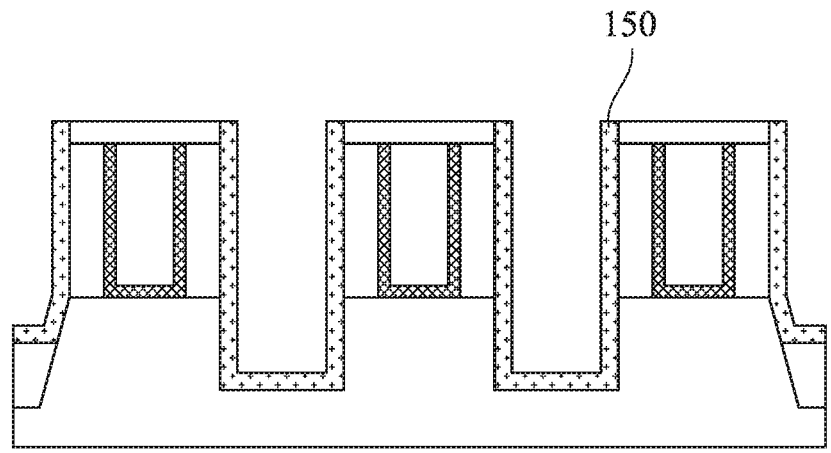
Figure 16:
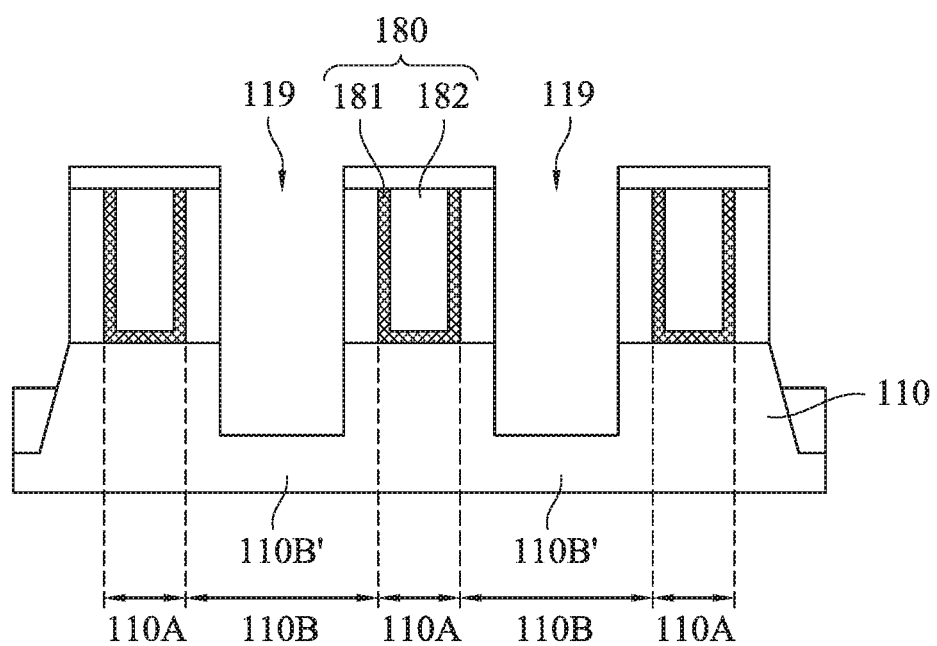

In FIGS. 15 and 16, the stress materials 160 (shown in FIG. 14) and the buffer layer 150 are removed, respectively. The stress materials 160 and the buffer layer 150 may be removed by etching processes. After the stress materials 160 and the buffer layer 150 are removed, a plurality of recesses 119 are formed in the source/drain portions 110B of the fin structure 110 and between the gate stacks 180. Accordingly, the surfaces of the recessed portions 110B' of the source/drain portion 110B of the fin structure 110 are exposed. After the stress materials 160 are removed, the gate stacks 180 may keep the tensile strain induced on the channel portions 110A of the fin structure 110.

Figure 17:
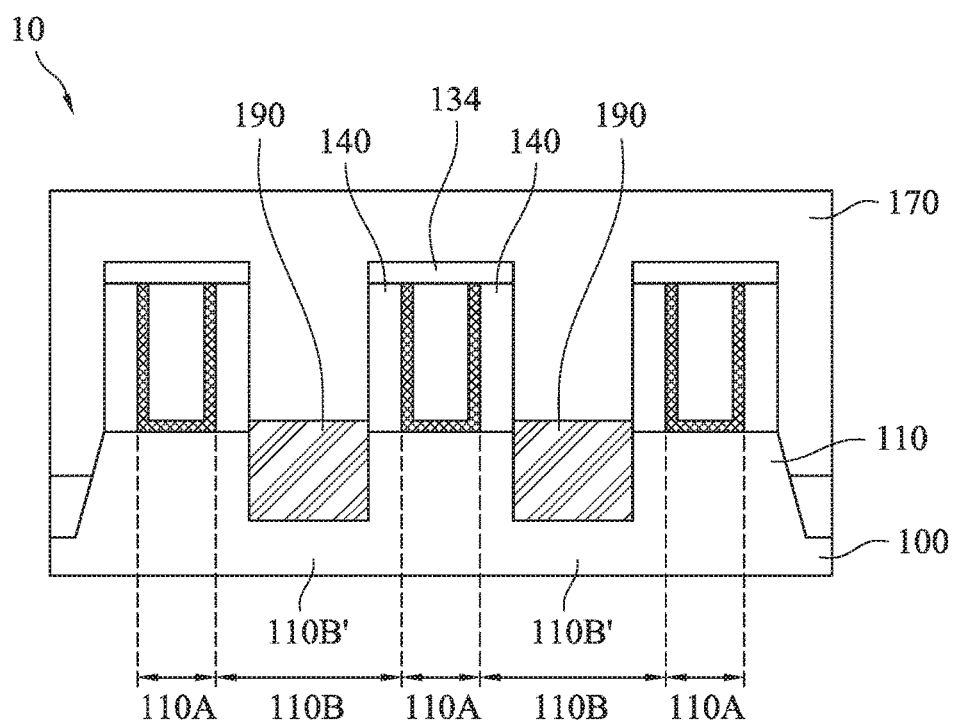

Reference is made to FIG. 17. A plurality of epitaxy structures 190 are respectively formed in the recesses 119 (shown in FIG. 16) and on the source/drain portions 110B of the fin structure 110. That is, the epitaxy structures 190 are formed respectively on the recessed portions 110B' of the source/drain portion 110B of the fin structure 110. In some embodiments, the epitaxy structures 190 can be n-type epitaxy structures. The epitaxy structures 190 may be formed using one or more epitaxy or epitaxial (epi) processes, such that Si features, SiGe features, and/or other suitable features can be formed in a crystalline state on the fin structure 110. In some embodiments, lattice constants of the epitaxy structures 160 is different from lattice constants of the fin structure 110, and the epitaxy structures 160 is strained or stressed to enable carrier mobility of the semiconductor device and enhance the device performance. The epitaxy structures 190 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, for a NMOS transistor, the epitaxy structures 190 may include SiP, SiC, SiPC, Si, III-V compound semiconductor materials, or combinations thereof for the n-type epitaxy structure. The epitaxy structures 190 may have non-facet surfaces for the n-type epitaxy structure. During the formation of the n-type epitaxy structure, n-type impurities such as phosphorous or arsenic may be doped with the proceeding of the epitaxy. For example, when the epitaxy structures 190 include SiC or Si, n-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 110 (e.g., silicon). Thus, a strained channel can be achieved to increase carrier mobility and enhance device performance. The epitaxy structures 190 may be in-situ doped. If the epitaxy structures 160 are not in-situ doped, a second implantation process (i.e., a junction implant process) is performed to dope the epitaxy structures 190. One or more annealing processes may be performed to activate the epitaxy structures 190. The annealing processes include rapid thermal annealing (RTA) and/or laser annealing processes.

After the epitaxy structures 190 are formed, an interlayer dielectric 170 is formed over the substrate 100 and at outer sides of the gate spacers 140 to form the semiconductor device 10. Accordingly, the interlayer dielectric 170 covers the epitaxy structures 190 and the fourth mask 134. The interlayer dielectric 170 is in contact with the gate spacers 140 and the fourth mask 134. Moreover, the fourth mask 134 includes a plurality of through holes 134a respectively above the epitaxy structures 190. Portions of the interlayer dielectric 170 are disposed in the through holes 134a.

The interlayer dielectric 170 may include silicon oxide, oxynitride or other suitable materials. The interlayer dielectric 170 includes a single layer or multiple layers. The interlayer dielectric 170 can be formed by a suitable technique, such as CVD or ALD. A chemical mechanical planarization (CMP) process may be applied to remove excessive interlayer dielectric 170. Another recessing process may be performed to the dielectric layer to form a plurality of openings (not shown) that expose the epitaxy structures 190. Metal such as tungsten is then deposited into the openings down to the epitaxy structures 190 to form source/drain contacts (not shown) in the interlayer dielectric 170.

According to the aforementioned embodiments, a dummy gate structure is formed on a substrate, and a stress material formed in a source/drain portion of a substrate after forming the dummy gate structure to induce a tensile strain on a channel portion of the substrate. After forming the stress material, the dummy gate structure is removed to further enhance the tensile strain on the channel portion of the substrate induced by the stress material. A gate stack is then formed on the channel portion of the substrate and maintains the tensile strain on the channel portion. With this configuration, a strain channel is formed in the substrate and the performance of the semiconductor device can be improved.

According to some embodiments, a method for manufacturing a semiconductor device, including forming a dummy gate structure on a substrate, in which the substrate has a source/drain portion and a channel portion adjacent to the source/drain region, and the dummy gate structure is formed on the channel portion of the substrate; recessing at least a part of the source/drain portion to form a recess in the source/drain portion of the substrate; forming a stress material in the recess; replacing the dummy gate structure with a gate stack; removing the stress material in the recess after the replacing the dummy gate structure with the gate stack; and forming an epitaxy structure in the recess.

According to some embodiments, a method for manufacturing a semiconductor device, including forming a fin structure on a substrate, in which the fin structure includes a channel portion and two source/drain portions adjacent to the channel portion; forming a dummy gate structure on the channel portion of the fin structure; forming two gate spacers respectively on opposite sidewalls of the dummy gate structure; recessing at least parts of the source/drain portions to form recesses in the fin structure; forming stress materials on the substrate and respectively in the recesses of the fin structure; removing the dummy gate structure to form an opening between the gate spacers; forming a gate stack in the opening; removing the stress material after the forming the gate stack; and forming epitaxy structures respectively in the recesses.

According to some embodiments, a semiconductor device, including a substrate; a fin structure disposed on the substrate, in which the fin structure includes a channel portion and at least one recessed portion adjacent to the channel portion; at least one epitaxy structure disposed on the recessed portion of the fin structure; a gate stack disposed on the channel portion of the fin structure; at least one gate spacer disposed on at least one sidewall of the gate stack; a hard mask disposed on the gate stack and the gate spacer; and an interlayer dielectric disposed on the source/drain feature and in contact with the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a dummy gate structure on a substrate, wherein the substrate has a source/drain portion and a channel portion adjacent to the source/drain region, and the dummy gate structure is formed on the channel portion of the substrate;
   recessing at least a part of the source/drain portion to form a recess in the source/drain portion of the substrate;
   forming a stress material in the recess;
   replacing the dummy gate structure with a gate stack;
   removing the stress material in the recess after the replacing the dummy gate structure with the gate stack; and
   forming an epitaxy structure in the recess.

2. The method of claim 1, wherein the stress material includes silicon carbide (SiC), silicon nitride (SiN), silicon oxycarbide (SiOC), or amorphous silicon (a-Si).

3. The method of claim 1, further comprising forming a buffer layer in the recess before forming the stress material.

4. The method of claim 1, further comprising forming a mask on the stress material before the replacing the dummy gate structure with the gate stack.

5. The method of claim 1, wherein the replacing comprises:
   removing the dummy gate structure; and
   forming the gate stack on the channel portion of the substrate.

6. The method of claim 1, further comprising forming a mask on the gate stack before the removing the stress material.

7. The method of claim 6, further comprising partially removing the gate stack before the forming the mask.

8. The method of claim 6, further comprising forming an interlayer dielectric to cover the mask and the epitaxy structure.

9. A method for manufacturing a semiconductor device, comprising:
   forming a fin structure on a substrate, wherein the fin structure comprises a channel portion and two source/drain portions adjacent to the channel portion;
   forming a dummy gate structure on the channel portion of the fin structure;
   forming two gate spacers respectively on opposite sidewalls of the dummy gate structure;

recessing at least parts of the source/drain portions to form recesses in the fin structure;

forming stress materials on the substrate and respectively in the recesses of the fin structure;

removing the dummy gate structure to form an opening between the gate spacers;

forming a gate stack in the opening;

removing the stress material after the forming the gate stack; and forming epitaxy structures respectively in the recesses.

10. The method of claim 9, wherein the stress materials include silicon carbide (SiC), silicon nitride (SiN), silicon oxycarbide (SiOC), or amorphous silicon (a-Si).

11. The method of claim 9, further comprising conformally forming a buffer layer on the dummy gate structure, the gate spacers, and in the recesses before the forming the stress material.

12. The method of claim 9, further comprising forming a first mask and a second mask on the dummy gate structure before forming the gate spacers, wherein the second mask is formed over the first mask.

13. The method of claim 12, further comprising removing portions of the stress materials and the second mask, wherein the first mask is exposed after the removing the second mask.

14. The method of claim 13, further comprising:

forming a third mask on the stress materials, the gate spacers, and the first mask; and removing the first mask and portions of the third mask to expose the dummy gate structure, wherein remaining portions of the third mask are respectively formed on the stress materials.

15. The method of claim 9, wherein the forming the gate stack comprises:

forming a gate dielectric in the opening; and forming a gate metal in the opening and on the gate dielectric.

16. The method of claim 15, further comprising:

partially removing the gate spacers, the gate dielectric, and the gate metal; and forming a fourth hard mask on the gate spacers, the gate dielectric, and the gate metal.

17. A method for manufacturing a semiconductor device, comprising:

forming a dummy gate structure at a channel region of a substrate;

forming a stress material at a source/drain region of the substrate, wherein the source/drain region is adjacent to the channel region;

replacing the dummy gate structure with a metal gate structure; and replacing the stress material with an epitaxy material after replacing the dummy gate structure with the metal gate structure.

18. The method of claim 17, wherein the stress material comprises silicon carbide (SiC), silicon nitride (SiN), silicon oxycarbide (SiOC), or amorphous silicon (a-Si).

19. The method of claim 17, further comprising:

forming a mask over the stress material prior to replacing the dummy gate structure with the metal gate structure.

20. The method of claim 17, further comprising:

etching the metal gate structure to reduce a height of the metal gate structure; and forming a mask over the metal gate structure prior to replacing the stress material with the epitaxy material.

* * * * *